(12) United States Patent
Bai et al.

(10) Patent No.: US 11,017,743 B2
(45) Date of Patent: May 25, 2021

(54) SCREEN, SCREEN STRUCTURE, USER EQUIPMENT, AND METHOD FOR CONTROLLING SCREEN

(71) Applicant: Beijing Xiaomi Mobile Software Co., Ltd., Beijing (CN)

(72) Inventors: Jian Bai, Beijing (CN); Lintao Zhang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/555,352

(22) Filed: Aug. 29, 2019

(65) Prior Publication Data

US 2020/0135148 A1  Apr. 30, 2020

(30) Foreign Application Priority Data

Oct. 31, 2018  (CN) .......................... 201811290034.3

(51) Int. Cl.
*G09G 5/14* (2006.01)
*G09G 3/20* (2006.01)
*H04M 1/02* (2006.01)
*G09G 3/3225* (2016.01)
*G09G 3/36* (2006.01)

(52) U.S. Cl.
CPC .............. *G09G 5/14* (2013.01); *G09G 3/2003* (2013.01); *H04M 1/0266* (2013.01); *G09G 3/3225* (2013.01); *G09G 3/3648* (2013.01); *G09G 2300/0443* (2013.01); *G09G 2300/0452* (2013.01); *G09G 2300/0465* (2013.01); *G09G 2320/0242* (2013.01); *G09G 2320/0276* (2013.01)

(58) Field of Classification Search
CPC ...... G09G 5/14; G09G 3/2003; G09G 3/3225; G09G 3/3648; G09G 2300/0443; G09G 2300/0452; G09G 2300/0465; G09G 2300/0242; G09G 2300/0276; H04M 1/0266

See application file for complete search history.

(56) References Cited

U.S. PATENT DOCUMENTS

| 9,672,778 B2* | 6/2017 | Lim ..................... G09G 3/3614 |
| 9,857,651 B2* | 1/2018 | Zeng .................... G02F 1/1368 |
| 9,905,146 B2* | 2/2018 | Wang ................... G09G 3/3648 |

(Continued)

FOREIGN PATENT DOCUMENTS

| CN | 106935615 A | 7/2017 |
| CN | 107610635 A | 1/2018 |

(Continued)

OTHER PUBLICATIONS

European Search Report in the European Application No. 19196961.7 dated Dec. 12, 2019.

(Continued)

*Primary Examiner* — Sejoon Ahn
(74) *Attorney, Agent, or Firm* — Finnegan, Henderson, Farabow, Garrett & Dunner, L.L.P.

(57) ABSTRACT

A screen includes a substrate and a display layer located on top of the substrate. The display layer includes a primary display area and a secondary display area. A form of pixel distribution in the secondary display area differs from that in the primary display area.

17 Claims, 8 Drawing Sheets

(56) References Cited

U.S. PATENT DOCUMENTS

| | | | | |
|---|---|---|---|---|
| 10,349,833 B2* | 7/2019 | Kondo | | G06Q 50/22 |
| 2007/0052857 A1* | 3/2007 | Song | | G09G 5/006 |
| | | | | 348/565 |
| 2015/0102315 A1 | 4/2015 | Lee et al. | | |
| 2015/0116235 A1* | 4/2015 | Fujisawa | | G06F 3/041 |
| | | | | 345/173 |
| 2016/0141353 A1 | 5/2016 | Kim et al. | | |
| 2016/0300891 A1* | 10/2016 | Ren | | H01L 27/3213 |
| 2018/0165533 A1 | 6/2018 | Cho et al. | | |
| 2018/0182278 A1 | 6/2018 | Kim et al. | | |
| 2019/0156708 A1* | 5/2019 | Li | | H01L 27/3276 |

FOREIGN PATENT DOCUMENTS

| | | | |
|---|---|---|---|
| CN | 108257514 | A | 7/2018 |
| CN | 108269840 | A | 7/2018 |
| CN | 108364967 | A | 8/2018 |
| CN | 108461521 | A | 8/2018 |
| CN | 108648679 | A | 10/2018 |
| CN | 207947007 | U | 10/2018 |
| CN | 209056269 | U | 7/2019 |
| EP | 3343555 | A2 | 7/2018 |
| JP | H8-54861 | | 2/1996 |
| JP | 2010-113260 | | 5/2010 |
| KR | 20100104990 | A | 9/2010 |
| KR | 20170041190 | A | 4/2017 |
| KR | 20170142839 | A | 12/2017 |
| KR | 20130077413 | A | 7/2018 |
| KR | 20180100012 | A | 9/2018 |
| RU | 2016147529 | A | 10/2018 |

OTHER PUBLICATIONS

First Office Action of the Russian Application No. 2019130432, dated May 18, 2020.
First Office Action of the Korean Application No. 10-2019-7029352, dated Aug. 30, 2020.
Notification of Reason for Refusal dated Mar. 31, 2021, from Intellectual Properly Office of Korea in counterpart Korean Application No. 10-2019-7029352.

* cited by examiner

SCREEN, SCREEN STRUCTURE, USER EQUIPMENT, AND METHOD FOR CONTROLLING SCREEN

CROSS-REFERENCE TO RELATED APPLICATIONS

This application is based on and claims priority to Chinese Patent Application No. 201811290034.3 filed on Oct. 31, 2018, the entire content of which is incorporated herein by reference.

TECHNICAL FIELD

The present disclosure relates to the field of display technology, and in particular to a screen of user equipment (UE), a screen structure, a method and apparatus for controlling a screen of UE, and UE.

BACKGROUND

There has been a pursuit of an increasingly higher screen ratio in the mobile phone industry. Expectation is to produce a mobile phone with a screen ratio close to 100%.

A key to improving and maximizing a screen ratio of a mobile phone is to arrange a functional device such as a camera, an earphone, a light sensor, a distance sensor, a fingerprint sensor, etc.) on a front panel of the mobile phone reasonably. It is conceived to arrange the functional device below the screen of the mobile phone, such that space on the front panel of the mobile phone that would have been occupied by the functional device become fully available, thereby improving the screen ratio.

However, some optical devices, such as a camera, a light sensor, an infrared transmitter, an infrared receiver, etc., may have to receive or transmit light in work. When such optical devices are arranged below the screen of a mobile phone, such optical devices may have degraded work performance, or even fail to work properly, under impact of translucence of the screen of the mobile phone.

SUMMARY

According to a first aspect, a screen of user equipment (LIE) may include a substrate and a display layer located on top of the substrate. The display layer may include a primary display area and a secondary display area. A form of pixel distribution in the secondary display area may differ from that in the primary display area.

According to a second aspect, a screen structure may include n sub-pixel sequences, n being a positive integer. Each of the n sub-pixel sequences may include at least two sub-pixels. The at least two sub-pixels may be of identical color. The screen structure may include at least two sub-pixels of identical color sharing one wire.

According to a third aspect, the UE may include the screen of the first aspect. An optical device may be arranged below the secondary display area. The optical device may include at least one of a camera, a light sensor, a proximity sensor, an optic transmitter, or an optic receiver.

According to a fourth aspect, a method for controlling the screen of the first aspect may include one or more steps as follows. A first synchronization signal may be sent to the primary display area. A second synchronization signal may be sent to the secondary display area. The first synchronization signal and the second synchronization signal may serve to control simultaneous display of one content by both the primary display area and the secondary display area.

The UE may include a processor and a memory. The memory may store instructions executable by the processor. The processor may be configured to: send a first synchronization signal to the primary display area, and send a second synchronization signal to the secondary display area. The first synchronization signal and the second synchronization signal may serve to control simultaneous display of one content by both the primary display area and the secondary display area.

According to a fifth aspect, a non-transitory computer-readable storage medium has stored thereon a computer program that, when executed by a processor, causes the processor to perform the method of the fourth aspect.

The above general description and elaboration below are exemplary and explanatory, and do not limit the subject disclosure.

BRIEF DESCRIPTION OF THE DRAWINGS

The drawings here constitute part of the subject disclosure, and together with the description, serve to explain the principle of the subject disclosure.

DETAILED DESCRIPTION

Figure 1:
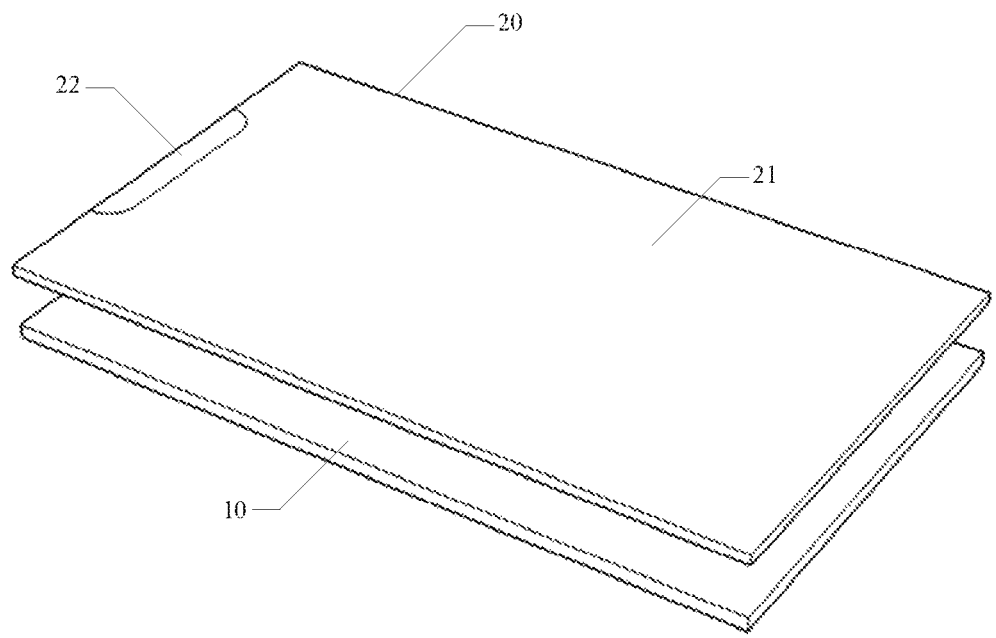
FIG. 1 is a schematic diagram of a screen of UE according to an exemplary embodiment.

Exemplary embodiments are described below. The following description refers to the accompanying drawings, in which identical or similar elements in two drawings are denoted by identical reference numerals unless indicated otherwise. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

A term used in an embodiment herein is merely for describing the embodiment instead of limiting the present disclosure. A singular form "a" and "the" used in an embodiment herein and the appended claims may also be intended to include a plural form, unless clearly indicated otherwise by context. Further note that a term "and/or" used herein may refer to and contain any combination or all possible combinations of one or more associated listed items.

Although a term such as first, second, third may be adopted in an embodiment herein to describe various kinds of information, such information should not be limited to such a term. Such a term is merely for distinguishing information of the same type. For example, without departing from the scope of the embodiments herein, the first information may also be referred to as the second information. Similarly, the second information may also be referred to as the first information. Depending on the context, "if" as used herein may be interpreted as "when" or "while" or "in response to determining that".

In addition, described characteristics, structures or features may be combined in one or more implementation modes in any proper manner. In the following descriptions, many details are provided to allow a full understanding of embodiments herein. However, those skilled in the art will know that the technical solutions of embodiments herein may be carried out without one or more of the details; alternatively, another method, component, device, step, etc. may be adopted.

A block diagram shown in the accompanying drawings may be a functional entity which may not necessarily correspond to a physically or logically independent entity. Such a functional entity may be implemented in form of software, in one or more hardware modules or integrated circuits, or in different networks and/or processor devices and/or microcontroller devices.

FIG. 1 is a schematic diagram of a screen of user equipment (UE) according to an exemplary embodiment. For example, the UE may be a mobile phone. As shown in FIG. 1, the screen may include a substrate 10 and a display layer 20 located on top of the substrate 10.

The display layer 20 may serve to implement a display function of the screen. The display layer 20 may include a primary display area 21 and a secondary display area 22. The primary display area 21 and the secondary display area 22 both have the display function. There may be one or more secondary display areas 22. In FIG. 1, one secondary display area 22 is shown for illustration purpose.

The display layer 20 may include two distinct types of display areas, i.e., the primary display area 21 and the secondary display area 22. The primary display area 21 and the secondary display area 22 may be integral parts of one unified physical structure. That is, the display layer 20 may be one whole structure without being divided into multiple separate components.

If the display layer 20 includes multiple separate components, which are stitched together to form the display layer 20, then there may be a seam at a joint therein, ultimately leading to a seam between contents displayed by the respective components. Consequently, no integrated seamless display of content by the whole display layer 20 can be achieved.

However, as the primary display area 21 and the secondary display area 22 may be integral parts of one unified physical structure, there may be no seam between the two. Therefore, no seam may exist between content displayed by the primary display area 21 and content displayed by the secondary display area 22 Thus, integrated seamless display of content by the whole display layer 20 may be achieved.

The primary display area 21 may include multiple pixels. The secondary display area 22 may include one or more pixels. In general, a pixel may include sub-pixels of three different colors, i.e., Red (R), Green (G), and Blue (B). That is, a pixel may include at least one red sub-pixel, at least one green sub-pixel, and at least one blue sub-pixel. In some embodiments, a pixel may include sub-pixels of one color. For example, a pixel may include a sub-pixel of any one color of R, G, or B. In some embodiments, a pixel may include sub-pixels of two colors. For example, a pixel may include sub-pixels of any two colors of R, G, or B. In some embodiments, a pixel may include, in addition to at least one red sub-pixel, at least one green sub-pixel, and at least one blue sub-pixel, a sub-pixel of at least one other color, such as at least one white sub-pixel. The subject disclosure sets no limit as to the color and the number of sub-pixels contained in a pixel.

A form of pixel distribution in the secondary display area 22 may differ from that in the primary display area 21. The form of the pixel distribution may refer to the form of distribution of sub-pixels. The form of the pixel distribution may include, but is not limited to, at least one of a size of a pixel, an arrangement of pixels, or a density of pixel distribution. The size of a pixel in the secondary display area 22 may differ from the size of a pixel in the primary display area 21. That is, the size of a sub-pixel in the primary display area 21 and the size of a sub-pixel in the secondary display area 22 may differ. A sub-pixel in the secondary display area 22 may be greater in size than a sub-pixel in the primary display area 21. The arrangement of pixels in the secondary display area 22 may differ from the arrangement of pixels in the primary display area 21. That is, an arrangement of sub-pixels in the primary display area 21 and an arrangement of sub-pixels in the secondary display area 22 may differ. For example, sub-pixels in the primary display area 21 may be arranged according to a Delta arrangement. For example, sub-pixels in the secondary display area 22 may be arranged according to a standard Red-Green-Blue (RGB) arrangement. The density of pixel distribution in the secondary display area 22 may differ from the density of pixel distribution in the primary display area 21. That is, the density of sub-pixel distribution in the primary display area 21 and the density of sub-pixel distribution in the secondary display area 22 may differ. For example, the density of sub-pixel distribution in the primary display area 21 may be greater than the density of sub-pixel distribution in the secondary display area 22.

Figure 2:
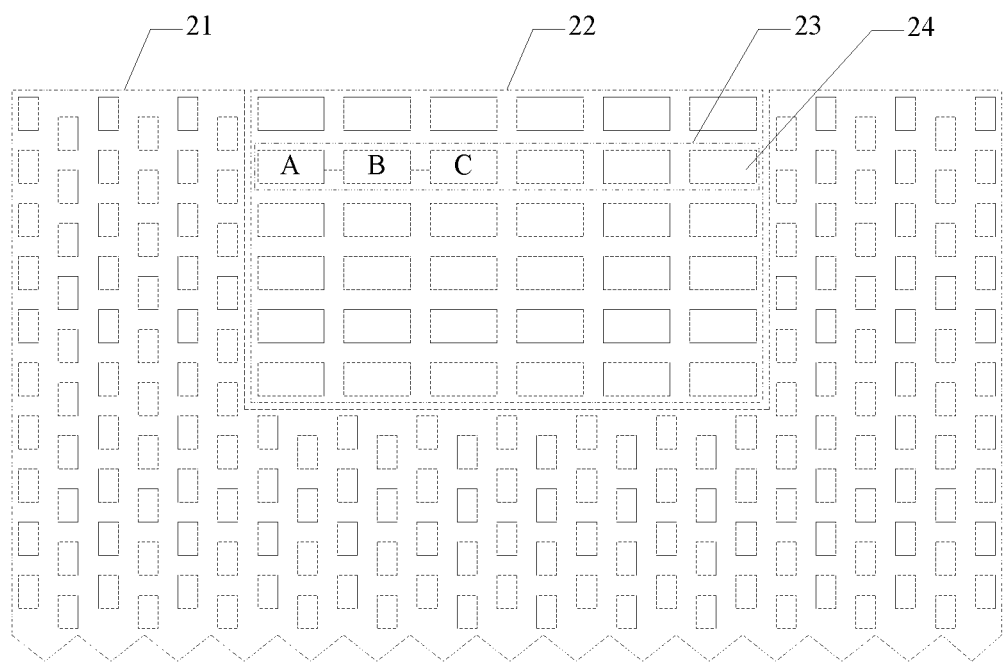
FIG. 2 to FIG. 9 are schematic diagrams of display layers according to exemplary embodiments.

As shown in FIG. 2, the secondary display area 22 may include n sub-pixel sequences 23. Each of the n sub-pixel sequences 23 may include at least two sub-pixels 24. Any sub-pixel sequence 23 may include sub-pixels 24 of identical color. The n may be a positive integer. A sub-pixel 24 may in general be of any of color R, G, or B. A sub-pixel sequence 23 may be a red sub-pixel sequence, a green sub-pixel sequence, or a blue sub-pixel sequence. A red sub-pixel sequence may include red sub-pixels. A green sub-pixel sequence may include green sub-pixels. A blue sub-pixel sequence may include blue sub-pixels.

The secondary display area 22 may include at least two sub-pixels of identical color that share one wire. For example, sub-pixels A, B, and C as illustrated in FIG. 2 may be of one color. For example, the 3 sub-pixels may all be red sub-pixels, or may all be green sub-pixels, or all be blue sub-pixels. And, the 3 sub-pixels may share one wire. The wire may refer to a power wire and/or a signal line for controlling display by a sub-pixel. A power wire may serve to provide a sub-pixel with voltage. A signal line may serve to provide a sub-pixel with a signal for controlling a pixel value, such as brightness or a gray scale, etc. The signal line may also be referred to as a data line.

In the above embodiments, a display layer of one whole structure may be formed on a substrate. The display layer may be divided into a primary display area and a secondary display area by a manufacturing process. A form of pixel distribution in the secondary display area may differ from that in the primary display area. The secondary display area may include at least one sub-pixel sequence. Each of the at least one sub-pixel sequence may include at least two sub-pixels. Any of the at least one sub-pixel sequence may include sub-pixels of identical color. The secondary display area may include at least two sub-pixels of identical color sharing one wire. Therefore, there are a decreased number of wires in the secondary display area, with optimized wire layout, such that there are a decreased number of devices such as a holding capacitor, a Thin Film Transistor (TFT), etc., in the secondary display area, thereby increasing transmittance of the secondary display area. Thus, one or more optical devices, such as a camera, a light sensor, a proximity sensor, an optic transmitter, an optic receiver, etc., may be arranged below the secondary display area, to provide optimal work performance.

Figure 3:
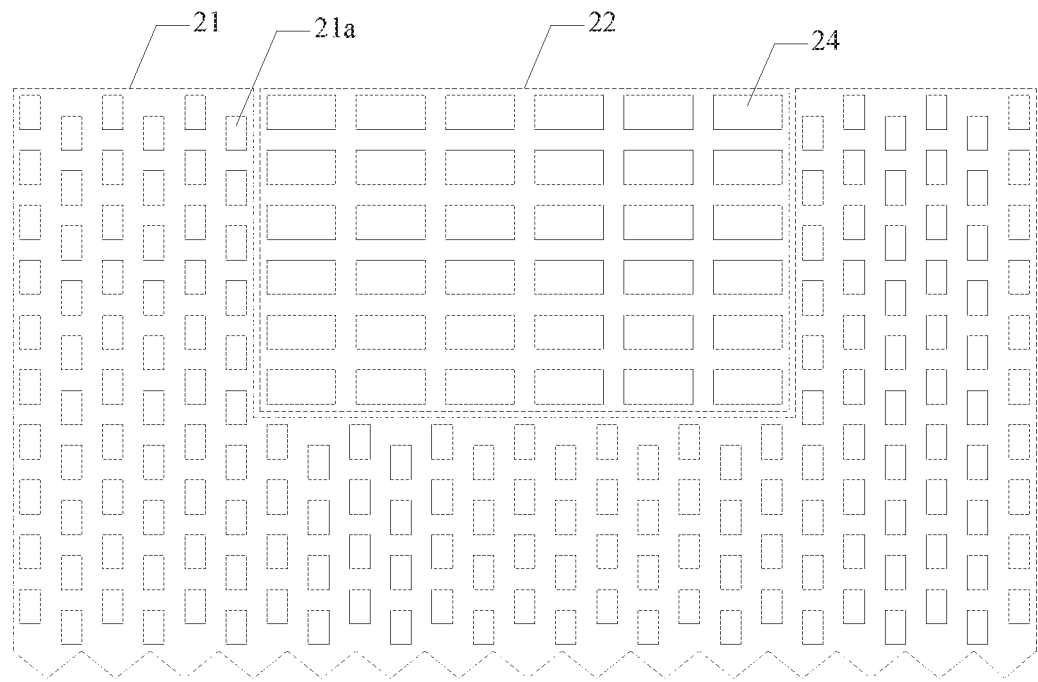

In exemplary embodiments, shown in FIG. 3, a sub-pixel 24 in the secondary display area 22 may be greater in size than a sub-pixel 21a in the primary display area 21. For example, the sub-pixel 24 in the secondary display area 22 may be greater in length than the sub-pixel 21a in the primary display area 21. For example, the sub-pixel 24 in the secondary display area 22 may be greater in width than the sub-pixel 21a in the primary display area 21. The length of a sub-pixel may be the length of a side of the sub-pixel along a crosswise direction. The width of a sub-pixel may be the length of a side of the sub-pixel along a lengthwise direction.

The sub-pixel 24 in the secondary display area 22 may be equal in length to the sub-pixel 21a in the primary display area 21, and greater in width than the sub-pixel 21a in the primary display area 21. For example, the sub-pixel 24 in the secondary display area 22 may have a width that is 2 times, 2.5 times, 3 times, 4 times, etc., of the width of the sub-pixel 21a in the primary display area 21, which is not limited in the embodiments.

The sub-pixel 24 in the secondary display area 22 may be equal in width to the sub-pixel 21a in the primary display area 21, and greater in length than the sub-pixel 21a in the primary display area 21. For example, the sub-pixel 24 in the secondary display area 22 may have a length that is 2 times, 2.5 times, 3 times, 4 times, etc., of the length of the sub-pixel 21a in the primary display area 21, which is not limited in the embodiments.

The sub-pixel 24 in the secondary display area 22 may be greater in both width and length than the sub-pixel 21a in the primary display area 21. For example, the sub-pixel 24 in the secondary display area 22 may have a width that is 2 times, 2.5 times, 3 times, 4 times, etc., of the width of the sub-pixel 21a in the primary display area 21, and may have a length that is 2 times, 2.5 times, 3 times, 4 times, etc., of the length of the sub-pixel 21a in the primary display area 21, which is not limited in the embodiments.

As the sub-pixel in the secondary display area 22 may be greater in size than the sub-pixel in the primary display area 21, the density of pixel distribution in the secondary display area 22 will be less than the density of pixel distribution in the primary display area 21. In this way, the number of wires in the secondary display area 22 may be minimized, with optimized wire layout, and an inter-pixel Pixel Delineation Layer (PDL) may be allowed to take on a shape as regular and bulky as possible, such that a translucent area (which may include sub-pixels and an area taken up by the PDL) in the secondary display area 22 may acquire better light transmission performance, and greater reflectivity and a greater index of refraction. Thus, one or more optical devices, such as a camera, a light sensor, a proximity sensor, an optic transmitter, an optic receiver, etc., may be arranged below the secondary display area to work properly.

Although a sub-pixel in the secondary display area 22 may be greater in size than a sub-pixel in the primary display area 21, given that the secondary display area 22 may occupy an area the ratio of which to the area of the whole screen is very small, in general only a single color may be displayed in the secondary display area 22 and in an area of the primary display area 21 that is around the secondary display area 22. Therefore, there will be barely any impact on the display result in the whole screen.

Not each sub-pixel in the secondary display area 22 has to be greater in size than a sub-pixel in the primary display area 21. One or more sub-pixels in the secondary display area 22 may be equal to, or even smaller than, a sub-pixel in the primary display area 21 in size, which is not limited in the embodiments.

In addition to the size of a pixel therein, the secondary display area 22 may differ from the primary display area 21 in terms of an arrangement of pixels, a density of pixel distribution, or another form of pixel distribution therein.

In the above embodiments, as the sub-pixel in the secondary display area may be greater in size than the sub-pixel in the primary display area, the density of pixel distribution in the secondary display area may be less than the density of pixel distribution in the primary display area. In this way, the number of wires in the secondary display area may be minimized, with optimized wire layout, and an inter-pixel Pixel Delineation Layer (PDL) may be allowed to take on a shape as regular and bulky as possible, such that a translucent area (which may include sub-pixels and an area taken up by the PDL) in the secondary display area may acquire better light transmission performance, and greater reflectivity and a greater index of refraction. Thus, one or more optical devices, such as a camera, a light sensor, a proximity sensor, an optic transmitter, an optic receiver, etc., may be arranged below the secondary display area to work properly.

The screen of the UE may have further characteristics as follows.

The secondary display area 22 may include n sub-pixel sequences. The n may be an integer greater than 1. The n sub-pixel sequences may be arranged one by one along a target direction. The target direction may be vertical or horizontal. Sub-pixels included in a sub-pixel sequence may be arranged one by one along a first direction. The n sub-pixel sequences may be arranged one by one along a second direction. The first direction and the second direction may be perpendicular to each other. For example, the first direction may be horizontal, and then the second direction may be vertical. Also for example, the first direction may be vertical, and then the second direction may be horizontal. For example, in FIG. 2, the secondary display area 22 may include 6 sub-pixel sequences 23. Each sub-pixel sequence 23 may include multiple sub-pixels 24. Sub-pixels 24 included in each sub-pixel sequence 23 may be arranged one by one along a horizontal direction. The 6 sub-pixel sequences 23 may be arranged one by one along a vertical direction.

The n sub-pixel sequences may include at least one red sub-pixel sequence, one green sub-pixel sequence, and one blue sub-pixel sequence. The at least one red sub-pixel sequence, one green sub-pixel sequence, and one blue sub-pixel sequence may be arranged alternately one by one along the target direction.

Figure 4:
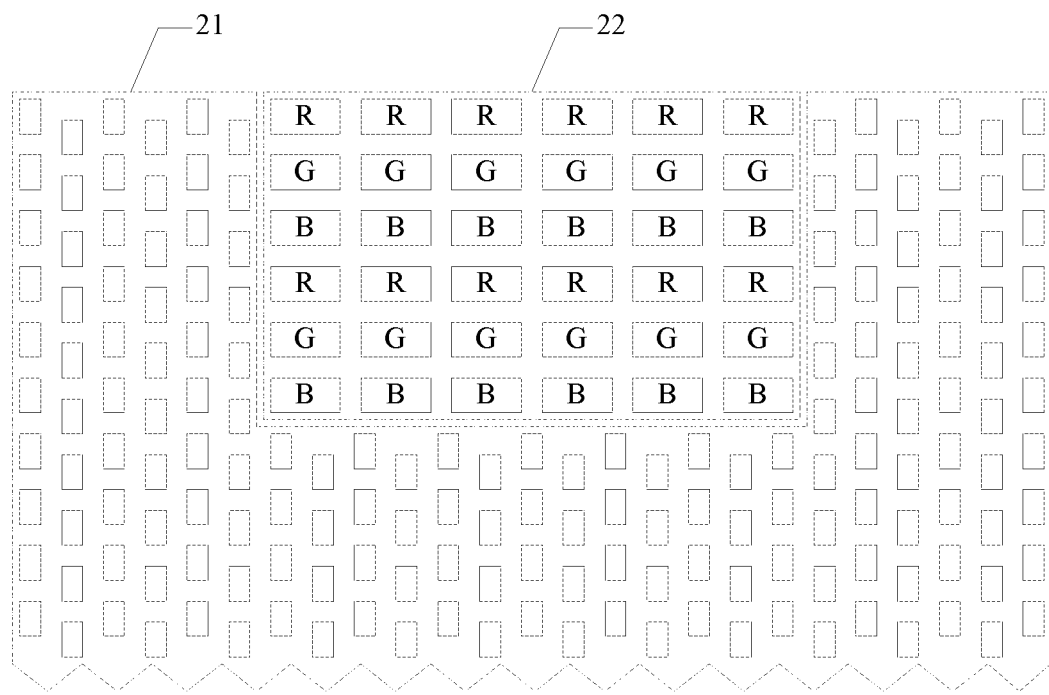

As shown in FIG. 4, in the secondary display area 22, sub-pixels included in each sub-pixel sequence may be arranged one by one along a horizontal direction. The secondary display area 22 may include at least one red sub-pixel sequence, one green sub-pixel sequence, and one blue sub-pixel sequence. The sub-pixel sequences may be arranged alternately one by one along a vertical direction in order of one red sub-pixel sequence, one green sub-pixel sequence, one blue sub-pixel sequence, . . . .

Figure 5:
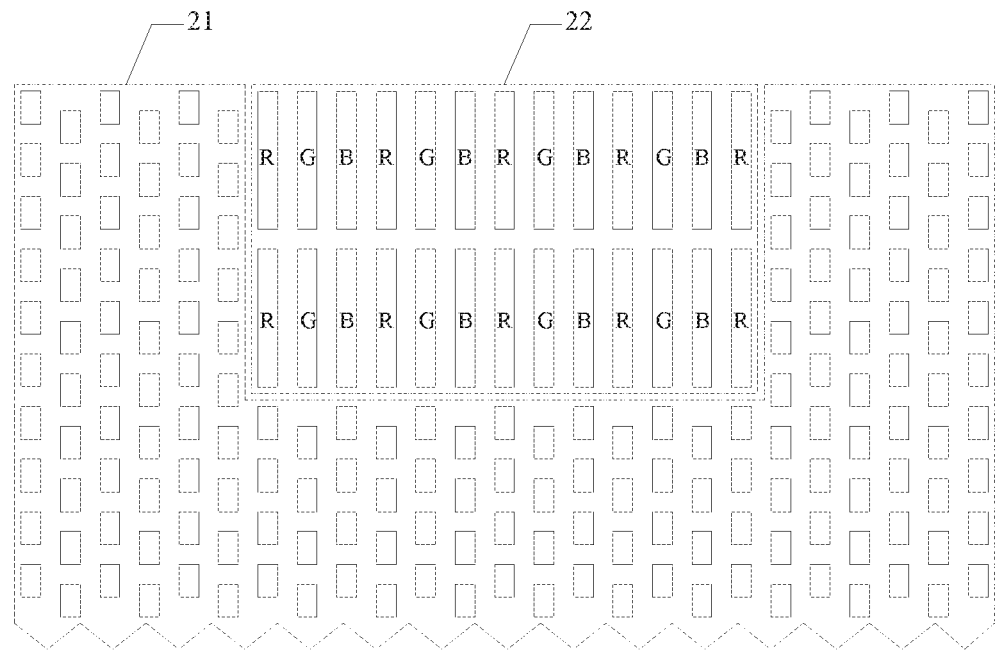

As shown in FIG. 5, in the secondary display area 22, sub-pixels included in each sub-pixel sequence may be arranged one by one along a vertical direction. The secondary display area 22 may include at least one red sub-pixel sequence, one green sub-pixel sequence, and one blue sub-pixel sequence. The sub-pixel sequences may be arranged alternately one by one along a horizontal direction in order of one red sub-pixel sequence, one green sub-pixel sequence, one blue sub-pixel sequence, . . . .

When the secondary display area 22 includes at least one red sub-pixel sequence, one green sub-pixel sequence, and one blue sub-pixel sequence, the three primary colors in the secondary display area 22 may be mixed, displaying a distinct color. When the secondary display area 22 includes the sub-pixel sequence(s) of one or two colors, the color that can be displayed by the secondary display area 22 may be limited. For example, when the secondary display area 22 includes the red sub-pixel sequence(s), the secondary display area 22 may display red. For example, when the secondary display area includes the red sub-pixel sequence (s) and the green sub-pixel sequence(s), the secondary display area 22 may display red and green, a color acquired by mixing red and green.

The embodiments herein set no limit as to a ratio of length to width of a sub-pixel in the secondary display area 22. For example, the ratio of length to width may be 1:1, 1:2, 1:3, 2:1, 3:1, or any other ratio. Sub-pixels in the secondary display area 22 may be identical or may differ in size. Sub-pixels of one color may be identical or may differ in size. Sub-pixels of distinct colors may be identical or may differ in size.

Of the n sub-pixel sequences of the secondary display area 22, there may be at least one sub-pixel sequence, center points of respective sub-pixels included in the at least one sub-pixel sequence being located on one straight line. For example, in examples of FIG. 4 and FIG. 5, of the n sub-pixel sequences of the secondary display area 22, any sub-pixel sequence may include sub-pixels with respective center points all located on one straight line.

Of the n sub-pixel sequences of the secondary display area 22, there may be at least one sub-pixel sequence, not all center points of respective sub-pixels included in the at least one sub-pixel sequence being located on one straight line. For example, in the example of FIG. 6 or FIG. 7, for any one sub-pixel sequence of the n sub-pixel sequences of the secondary display area 22, not all center points of respective sub-pixels included in the any one sub-pixel sequence are located on one straight line. In the secondary display area 22 as illustrated in FIG. 6 and FIG. 7, a sub-pixel sequence may be formed by sub-pixels of one color connected by a curve.

Of the a sub-pixel sequences of the secondary display area 22, an i-th sub-pixel sequence may include a 2k-th sub-pixel with a center point located on a first straight line and a (2k−1)-th sub-pixel with a center point located on a second straight line. The first straight line and the second straight line may be parallel. The i may be a positive integer no greater than the n. The k may be a positive integer. That is, center points of even (such as the 2nd, the 4th, the 6th, etc.) sub-pixels may be located on the first straight line, and center points of odd (such as the 1st, the 3rd, the 5th, etc.) sub-pixels may be located on the second straight line. Taking the red sub-pixel sequence on the 1st line in FIG. 6 or FIG. 7 as an example, center points of even sub-pixels may be located on the first straight line L1. Center points of odd sub-pixels may be located on the second straight line L2. The first straight line L1 and the second straight line L2 may be parallel.

Figure 6:
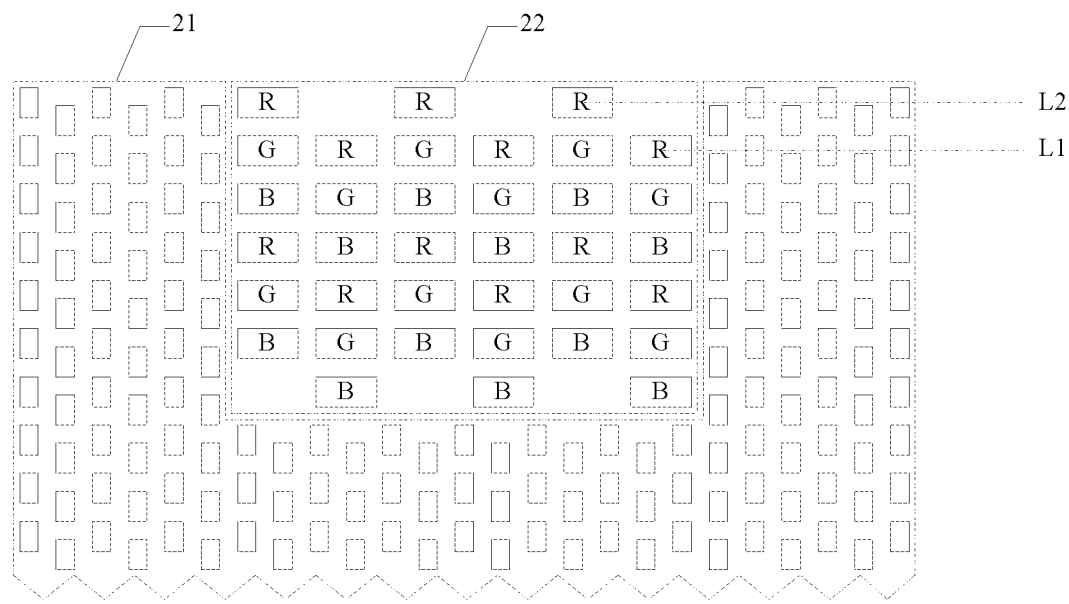
Figure 7:
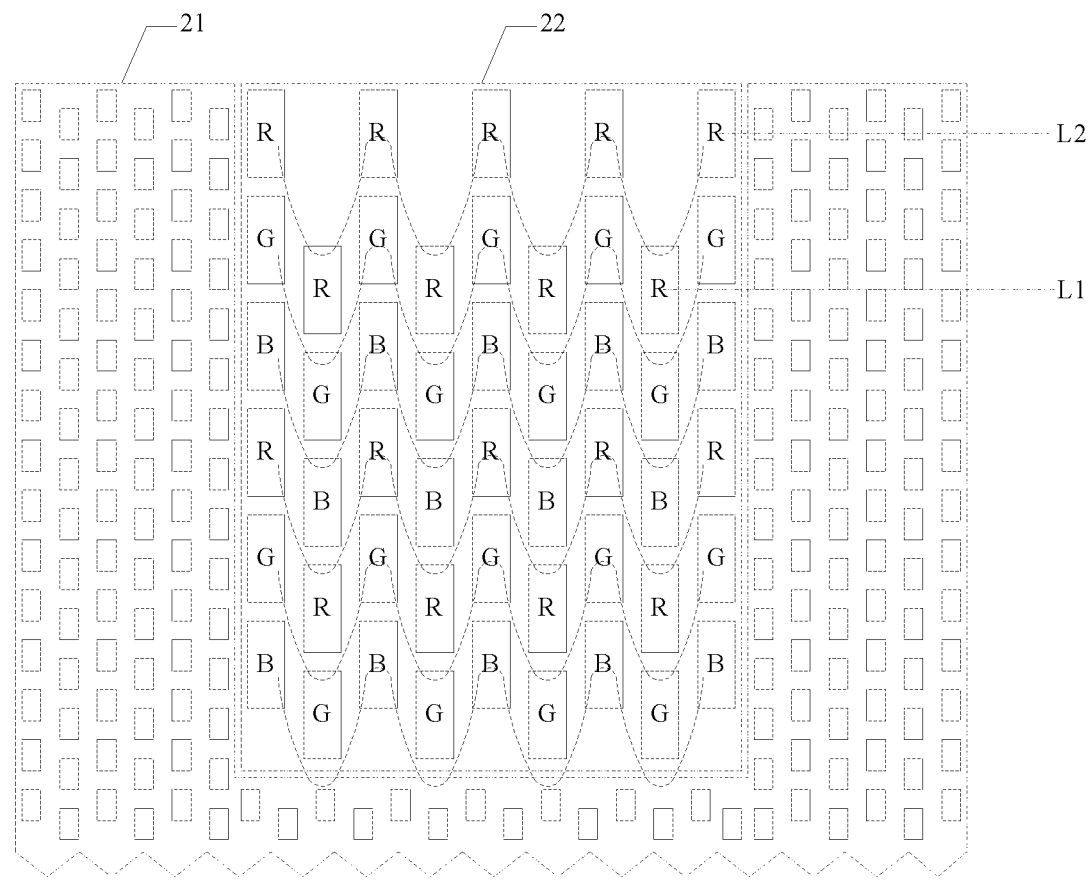

FIG. 6 and FIG. 7 illustrate cases where not all center points of respective sub-pixels included in one sub-pixel sequence are located on one straight line when the n sub-pixel sequences of the secondary display area 22 are arranged one by one along a vertical direction. When the n sub-pixel sequences are arranged one by one along a horizontal direction, not all center points of respective sub-pixels included in one sub-pixel sequence may be located on one straight line, either.

When center points of respective sub-pixels included in one sub-pixel sequence are located on one straight line, the wire may be simple, and pixel manufacture may get simpler. When not all center points of respective sub-pixels included in one sub-pixel sequence are located on one straight line, the wire may get more complicated. However, a better display result pray be achieved. For example, a display result may be achieved in the secondary display area 22 that is identical, or as close as possible, to that in the primary display area 21.

Figure 8:
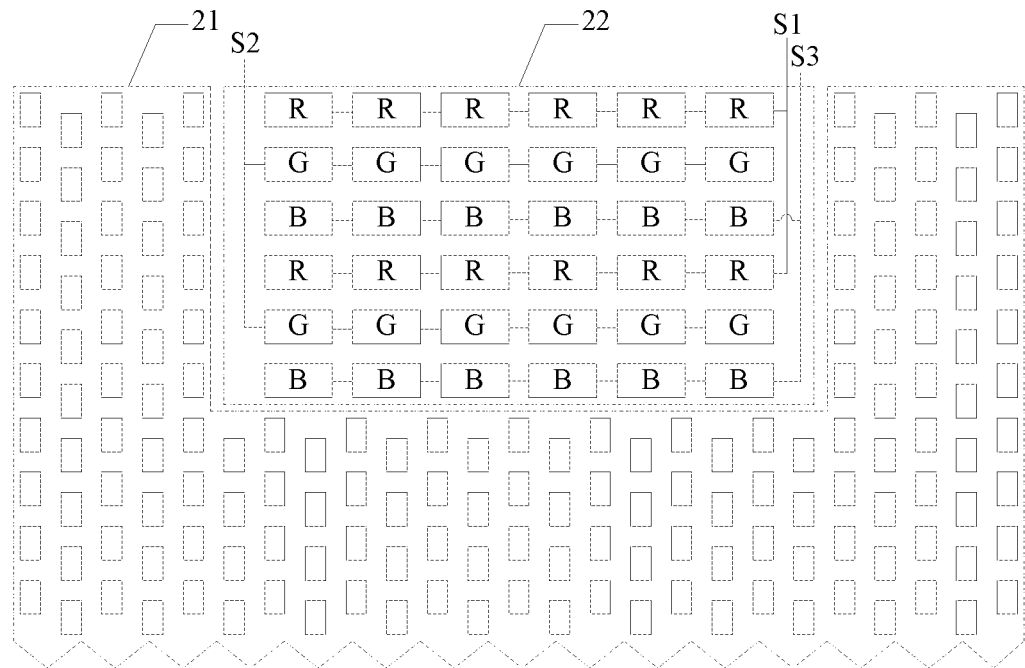

If the secondary display area 22 can display a single color, i.e., can display one color at a time, then sub-pixels of identical color in the secondary display area 22 may share one wire. As shown in FIG. 8, assuming that the secondary display area 22 includes sub-pixels of distinct colors R, C, B, all red sub-pixels in the secondary display area 22 may share one wire (referred to as the first wire S1). All green sub-pixels in the secondary display area 22 may share one wire (referred to as the second wire S2). All blue sub-pixels in the secondary display area 22 may share one wire (referred to as the third wire S3). Different wires may be used for sub-pixels of different colors. That is, the first wire S1, the second wire S2, and the third wire S3 may be three distinct wires. In this case, the secondary display area 22 may display R, G, B, or any one single color acquired as a mixture thereof. The secondary display area 22 may include sub-pixels of one or two colors. The secondary display area may include a sub-pixel of another color in addition to sub-pixels of distinct colors R, G, B. Regardless of the number of colors of sub-pixels included in the secondary display area 22, sub-pixels of identical color in the secondary display area 22 may be made to share one wire when the secondary display area 22 can display a single color.

Figure 9:
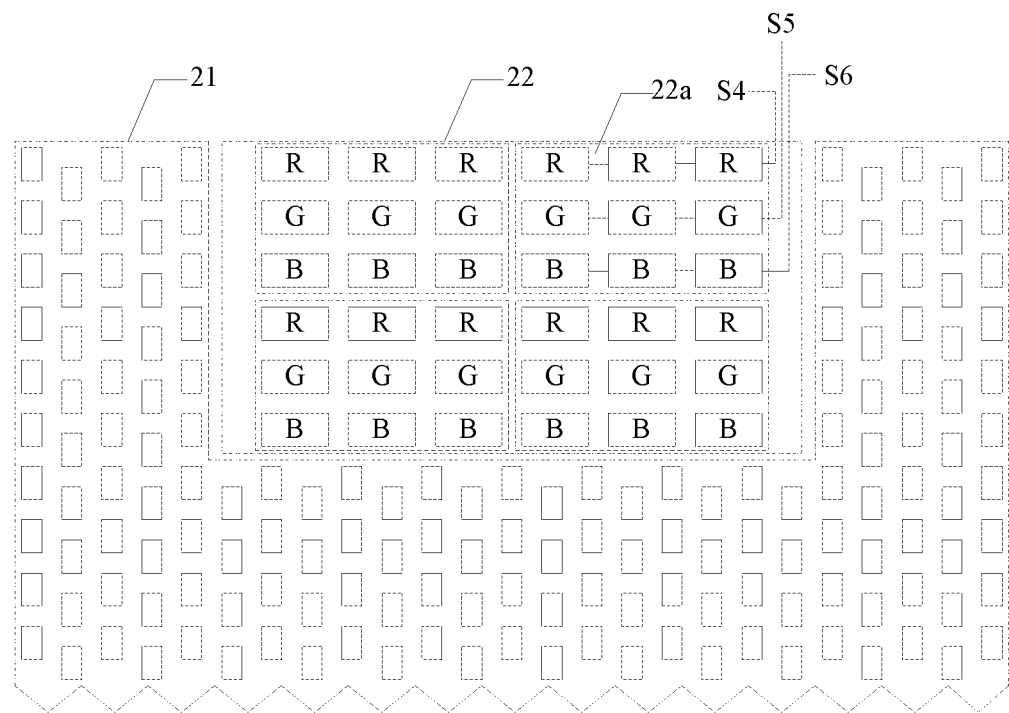

If the secondary display area 22 can display multiple colors, i.e., can display multiple colors at a time, then the secondary display area 22 may include at least two sub-areas. Sub-pixels of identical color in each of the at least two sub-areas may share one wire. Sub-pixels in different sub-areas may have separate wires. Each sub-area may include one or more sub-pixels. As shown in FIG. 9, the secondary display area 22 may be divided into 4 sub-areas 22a. For example, the sub-area 22a as shown in the upper right corner in FIG. 9 may include sub-pixels of distinct colors R, G, B. All red sub-pixels in the sub-areas 22a may share one wire (referred to as the fourth wire S4). All green sub-pixels in the sub-areas 22a may share one wire (referred to as the fifth wire S5). All blue sub-pixels in the sub-areas 22a may share one wire (referred to as the sixth wire S6). Different wires may be used for sub-pixels of different colors. That is, the fourth wire S4, the fifth wire S5, and the sixth wire S6 may be three distinct wires. Thus, each sub-area 22a may display R, G, B, or any one single color acquired as a mixture thereof. The whole secondary display area 22 may include multiple sub-areas 22a. Each sub-area 22a may display a single color. One single color or different single colors may be displayed in the respective sub-areas 22a. Therefore, the whole secondary display area 22 can display multiple colors. For example, in FIG. 9, each sub-area 22a may include sub-pixels of distinct colors R, G, B. A sub-area 22a may include sub-pixels of one or two colors. A sub-area may include a sub-pixel of another color in addition to sub-pixels of distinct colors R, G, B. No limit is set as to the number of sub-areas 22a the secondary display area 22 may include and how it is divided, which may be designed as needed. When the secondary display area 22 can display multiple colors, sub-areas included in the secondary display area 22 may display multiple color blocks, to meet more display demands.

Figure 10:
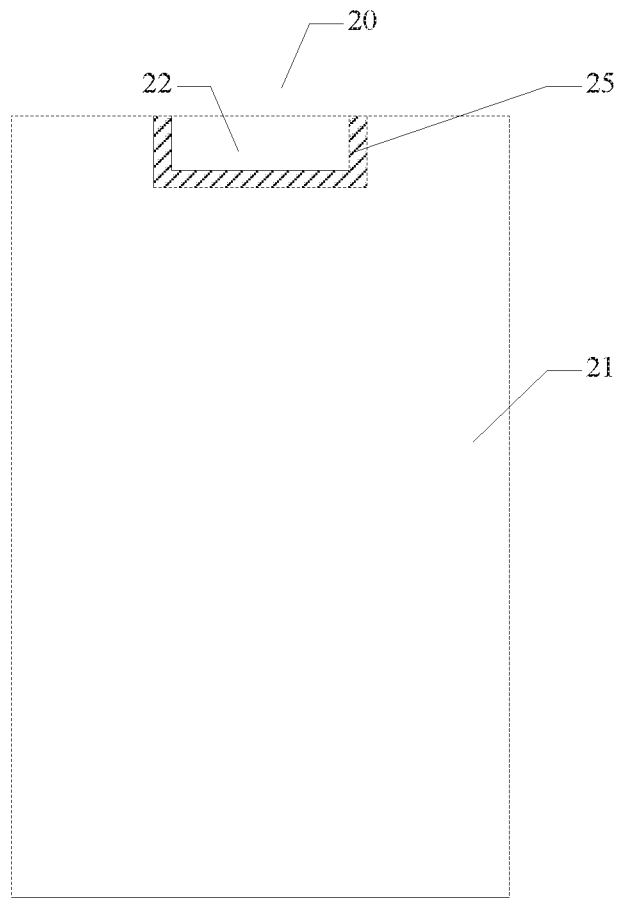
FIG. 10 is a schematic diagram of a transitional display layer according to an exemplary embodiment.

In an embodiment, shown in FIG. 10, the display layer 20 may further include a transitional display area 25. The transitional display area 25 may be located between the primary display area 21 and the secondary display area 22. A form of pixel distribution in the transitional display area 25 may differ from that in the primary display area 21 or that in the secondary display area 22. A sub-pixel in the transitional display area 25 may be greater in size than a sub-pixel in the primary display area 21. A sub-pixel in the transitional display area may be less in size than a sub-pixel in the secondary display area 22. Sub-pixels in the transitional display area 25 may be identical or may differ in size. The closer a sub-pixel is to the secondary display area 22, the greater it may be in size. The closer a sub-pixel is to the primary display area 21, the less it may be in size. In this way, the transition of a resolution between the primary display area 21 and the secondary display area 22 may be made smooth and natural, improving the display result of the whole screen.

Display in the primary display area 21, display in the secondary display area 22, and display in the transitional display area 25 may be controlled separately. That is, the primary display area 21, the secondary display area 22, and the transitional display area 25 may have separate wires. Thus, brightness and color displayed in the transitional display area 25 may be controlled separately. The primary display area 21 and the secondary display area 22 may display related content respectively. The transitional display area 25 may not be powered, such that the transitional display area 25 may appear to be black, so as to display specific content.

Spacing between sub-pixels in the secondary display area 22 may be equal, or as close as possible, to spacing between sub-pixels in the primary display area 21. For example, horizontal or vertical spacing between sub-pixels of one color in the secondary display area 22 may be equal, or as close as possible, to that in the primary display area 21. For the form of pixel distribution in the secondary display area 22 as shown in FIG. 6 or FIG. 7, a distance between the first straight line and the second straight line may equal a distance between center points of two sub-pixels of identical color in the primary display area 21. This may help improve the display result of the whole screen.

No limit is set as to how sub-pixels in the primary display area 21 are arranged. Sub-pixels in the primary display area may be arranged according to at least one of a Delta arrangement, a Pentile arrangement, or a standard Red-Green-Blue, RGB, arrangement.

No limit is set as to a shape of a section of the secondary display area 22, which may be a regular shape such as of a rectangle, a rounded rectangle, a circle, etc., or an irregular shape such as of a water drop, an arc, etc.

In the embodiments illustrated in FIG. 1 to FIG. 10, the secondary display area 22 is located on an edge or in the middle of the primary display area 21, for illustration purposes only. In an embodiment, the secondary display area 22 may be located next to a side of the primary display area 21. In an embodiment, the secondary display area 22 may be jointed to the primary display area 21 closely. In an embodiment, the display layer 20 may include both a secondary display area 22 at a gap in the primary display area 21, and a secondary display area 22 located next to a side of the primary display area 21.

The screen may have a regular shape. The regular shape may include any one of a rectangle, a rounded rectangle, or a circle. The screen may have an irregular shape. The present disclosure sets no limit thereto.

The substrate 10 may include a first substrate area located below the primary display area 21 and a second substrate area located below the secondary display area 22. The first substrate area may be that acquired by projection of the primary display area 21 on the substrate 10. The second substrate may be that acquired by projection of the secondary display area 22 on the substrate 10. Both the first substrate area and the second substrate area may be made of same material. That is, the substrate 10 may be a whole board made of same material. The substrate 10 may be made of glass. The substrate 10 may be made of Polyimide (PI). The first substrate area and the second substrate area may be made of different material. The first substrate area may be made of PI. The second substrate area may be made of glass. Glass may have better translucence compared to PI. Glass may be hard and unbending. A flexible screen may be produced using PI. In this way, as the first substrate area corresponding to the primary display area 21 may be made of PI, most of the screen may bend, implementing a flexible screen. The second substrate area corresponding to the secondary display area 22 may be made of glass with better translucence, such that an optic such as a camera, a sensor, etc., set below the secondary display area 22 may have better work performance.

The display layer 20 may in general be controlled by a driving Integrated Circuit (IC). The primary display area 21 and the secondary display area 22 may share one driving IC. For example, a driving IC may be divided into two parts, one for driving the primary display area 21, the other for driving the secondary display area 22. The primary display area 21 and the secondary display area 22 may use different driving ICs. For example, the screen of the UE may include two driving ICs, one for driving the primary display area 21, the other for driving the secondary display area 22. When the display layer 20 includes multiple secondary display areas 22, the multiple secondary display areas 22 may share one driving IC, or may use different driving ICs. The present disclosure sets no limit thereto.

In addition to the substrate 10 and the display layer 20, the screen of the UE may further include a touch sensing layer and a glass cover. The touch sensing layer may be located on top of the display layer 20. The glass cover may be located on top of the touch sensing layer. The touch sensing layer may serve to sense a touch. The touch sensing layer may serve to sense an operation, such as a click, a slide, a press, etc., from a finger of a user. The glass cover may serve to protect the screen and extend life of the screen.

A screen provided herein may be a Liquid Crystal Display (LCD) screen. A screen provided herein may be an Organic Light Emitting Display (OLED) screen. The OLED screen may be flexible or inflexible.

For an LCD screen, the display layer 20 may include an array of TFTs, a liquid crystal layer, and a Color Filter (CF) arranged in sequence from the bottom up. The substrate located below the display layer 20 may be made of glass, and may be referred to as a lower substrate. In general, an upper substrate may further be arranged on top of the display layer 20. The upper substrate may be made of glass. A lower polarizer may further be arranged below the lower substrate. An upper polarizer may further be arranged on top of the upper substrate. The LCD screen may further include a backlight module located below the lower polarizer.

For an OLED screen, the display layer 20 may include an Indium Tin Oxide (ITO) anode, a hole transport layer, an organic light-emitting layer, an electron transport layer, and a metal cathode arranged in sequence from the bottom up. The substrate located below the display layer 20 may be made of glass, plastic, a metal foil, or other material.

The above-described layered structure of the LCD screen and the OLED screen is exemplary and explanatory, and is not intended as a limit to the technical solution herein.

Figure 11:
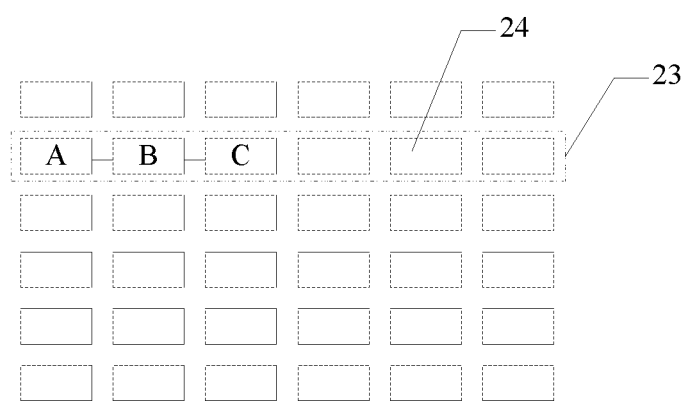
FIG. 11 is a schematic diagram of a screen structure according to an exemplary embodiment.

FIG. 11 is a schematic diagram of a screen structure according to an exemplary embodiment. The screen structure may include n sub-pixel sequences 23. The n may be a positive integer.

Each of the n sub-pixel sequences 23 may include at least two sub-pixels 24. Any sub-pixel sequence 23 may include sub-pixels 24 of identical color. A sub-pixel 24 may in general be of any of color R, G, or B. A sub-pixel sequence 23 may be a red sub-pixel sequence, a green sub-pixel sequence, or a blue sub-pixel sequence.

The screen structure may include at least two sub-pixels of identical color 24 that share one wire. For example, sub-pixels A, B, and C as illustrated in FIG. 11 may be of one color. For example, the 3 sub-pixels may all be red sub-pixels, or may all be green sub-pixels, or all be blue sub-pixels. And, the 3 sub-pixels may share one wire.

The screen structure may include at least two sub-pixels of identical color sharing one wire. Therefore, there are a decreased number of wires in the screen structure, with optimized wire layout, such that there are a decreased number of devices such as a holding capacitor, a Thin Film Transistor (TFT), etc., in the screen structure, thereby increasing transmittance of the screen structure. Thus, one or more optical devices, such as a camera, a light sensor, a proximity sensor, an optic transmitter, an optic receiver, etc., may be arranged below the screen structure to work properly.

The n may be an integer greater than 1. The n sub-pixel sequences may be arranged one by one along a target direction. The target direction may be vertical or horizontal.

The n sub-pixel sequences may include at least one red sub-pixel sequence, one green sub-pixel sequence, and one blue sub-pixel sequence. The at least one red sub-pixel sequence, one green sub-pixel sequence, and one blue sub-pixel sequence may be arranged alternately one by one along the target direction.

Of the n sub-pixel sequences, there may be at least one sub-pixel sequence, center points of respective sub-pixels included in the at least one sub-pixel sequence being located on one straight line.

Of the n sub-pixel sequences, there may be at least one sub-pixel sequence, not all center points of respective sub-pixels included in the at least one sub-pixel sequence being located on one straight line.

Of the n sub-pixel sequences, an i-th sub-pixel sequence may include a 2k-th sub-pixel with a center point located on a first straight line and a (2k−1)-th sub-pixel with a center point located on a second straight line. The first straight line and the second straight line may be parallel. The i may be a positive integer no greater than the n. The k may be a positive integer.

A distance between the first straight line and the second straight line may equal a distance between center points of two sub-pixels of identical color in the primary display area.

Sub-pixels of identical color in the screen structure may share one wire.

The screen structure may include at least two sub-areas. Sub-pixels of identical color in each of the at least two sub-areas may share one wire.

The screen structure according to the embodiment may have characteristics identical or similar to those of the secondary display area 22 in the screen. Refer to description of the secondary display area 22 in the screen for a detail not elaborated in the embodiment, which is not repeated here.

The screen structure according to the embodiment may be implemented separately as a screen of UE, or form a screen by combining with the primary display area 21 as the secondary display area 22.

UE may be provided according to an exemplary embodiment herein. The UE may be electronic equipment such as a mobile phone, a tablet, an E-book reader, multimedia playing equipment, wearable equipment, onboard UE, etc. The UE may include the screen according to any the embodiment described above.

Figure 12:
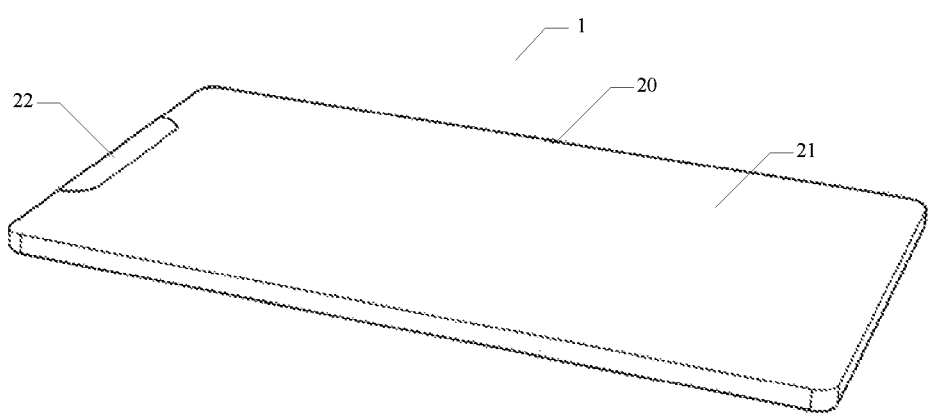
FIG. 12 is a schematic diagram of UE according to an exemplary embodiment.

As shown in FIG. 12, UE 1 may include a screen. The screen may include a substrate (not shown in FIG. 12) and a display layer located on top of the substrate 20. The screen may further include a touch sensing layer and a glass cover on top of the display layer 20.

As shown in FIG. 12, the display layer 20 may include a primary display area 21 and a secondary display area 22. In FIG. 12, the display layer 20 may include one secondary display area 22. The secondary display area 22 may be located at a gap formed on a top edge of the primary display area 21. Together the secondary display area 22 and the primary display area 21 may form a display layer 20 with a section showing a shape of a rounded rectangle. The secondary display area 22 and the primary display area 21 may be arranged according to another location relation, which is not limited in the embodiments.

The secondary display area 22 may include n sub-pixel sequences. Each of the n sub-pixel sequences may include at least two sub-pixels. Any one sub-pixel sequence may include sub-pixels of identical color. The n may be a positive integer. The secondary display area 22 may include at least two sub-pixels of identical color sharing one wire.

A sub-pixel in the secondary display area 22 may be greater in size than a sub-pixel in the primary display area 21.

With any one example above, the secondary display area 22 may be allowed to have high transmittance.

An optical device (not shown in FIG. 12) may be arranged below the secondary display area 22. The optical device may include, but is not limited to, at least one of a camera, a light sensor, a proximity sensor, an optic transmitter, or an optic receiver. The camera may serve to photograph. The camera may be a common camera, an infrared camera, a depth camera, etc. The light sensor may serve to collect ambient light intensity. The proximity sensor may serve to collect a distance to a front object. The optic transmitter may serve to transmit light. The optic transmitter may be an infrared transmitter or a transmitter for transmitting other light. The optic receiver may serve to receive light. The optic receiver may be an infrared receiver or a receiver for receiving other light.

In addition to the optical device, another functional device, such as an earphone, a biosensor, an environment sensor, a food safety detecting sensor, a health sensor, etc., may be arranged below the secondary display area 22. The earphone may serve to play sound. The biosensor may serve to identify biological characteristics of a user. The biosensor may be a fingerprint identifying sensor, an iris identifying sensor, etc. The environment sensor may serve to collect environmental information. The environment sensor may be a temperature sensor, a humidity sensor, an air pressure sensor, etc. The food safety detecting sensor may serve to detect an index of a hazardous substance in food. The food safety detecting sensor may be art optic sensor, a biometric sensor, etc. The health sensor may serve to collect information on health of a user, such as a heart rate, a blood pressure, heartbeats, or other body data of a user.

One or more devices may be arranged below the secondary display area 22. For example, a camera and a proximity sensor may be arranged below the secondary display area 22. When the display layer 20 includes multiple secondary display areas 22, a functional device may be arranged below one secondary display area 22, while no functional device may be arranged below another secondary display area 22. The same or different functional device(s) may be arranged respectively below two distinct secondary display areas 22. A camera and a proximity sensor may be arranged below one secondary display area 22. A fingerprint identifying sensor may be arranged below another secondary display area 22.

By having at least two sub-pixels of identical color in the secondary display area 22 share one wire, or having the sub-pixel in the secondary display area 22 be less in size than the sub-pixel in the primary display area 21, the number of wires in the secondary display area 22 may be minimized with optimized wire layout, such that there are a decreased number of devices such as a holding capacitor, a Thin Film Transistor (TFT), etc., in the secondary display area 22, thereby increasing transmittance of the secondary display area 22. Thus, an optical device may be arranged below the secondary display area to work properly.

In an exemplary embodiment, a method for controlling a screen of UE may be provided. The method may be executed by a driving IC of the screen, a processor in the UE, or interaction and collaboration of multiple components with processing capability in the UE. The method may include a step as follows. A first synchronization signal may be sent to the primary display area. A second synchronization signal may be sent to the secondary display area.

The first synchronization signal and the second synchronization signal may be for controlling simultaneous display of content by both the primary display area and the secondary display area. The content may also be referred to as one display or one frame. The primary display area and the secondary display area may be controlled respectively by two different driving ICs or different parts of one driving IC. Therefore, to display different parts of content respectively by the primary display area and the secondary display area, frame synchronization between the primary display area and the secondary display area may be used to avoid impact on the display result due to the primary display area and the secondary display area displaying different frames.

With a screen of UE provided herein, content displayed in the primary display area and content displayed in the secondary display area may combine to form a complete display content, equivalent to that can be displayed by another screen with an identical size and an identical shape as the screen, however not divided into the primary display area and the secondary display area. With high transmittance of the secondary display area, an optical device may be arranged below the secondary display area to work properly. Thereby, an optical device, as well as another functional device, that should have been deployed on a front panel of the UE, may now be arranged below the screen of the UE, without compromising quality of display of the screen, such that the screen ratio of the screen may get closer to or even reach 100%.

The method may further include a step as follows. A raw color component of the content to be displayed in the primary display area may be acquired. A raw color component of the content to be displayed in the secondary display area may be acquired. A corrected color component of the content to be displayed in the primary display area may be acquired by performing Gamma correction on the primary display area. A corrected color component of the content to be displayed in the secondary display area may be acquired by performing Gamma correction on the secondary display area. The corrected color component of the content to be displayed in the primary display area may be sent to the primary display area. The corrected color component of the content to be displayed in the secondary display area may be sent to the secondary display area.

The primary display area and the secondary display area may be manufactured with different properties (such as the form of the pixel distribution). Therefore, the primary display area and the secondary display area may use different color components to present one color result. The color component may include respective color components R, G, B. For example, when an upper layer application requires to display on the screen a red area, one part of which on the primary display area displaying, the other part of which on the secondary display area, if identical color components (such as 255, 0, 0 corresponding respectively to R, G, B) are sent to the primary display area and the secondary display area, the color displayed by the primary display area according to the color component 255/0/0 and that displayed by the secondary display area according to the color component 255/0/0 may somehow appear different to the naked eye. Therefore, by performing Gamma correction respectively on the primary display area and the secondary display area, the primary display area and the secondary display area may present the identical color result, when one color is to be displayed.

Given a density of pixel distribution in the primary display area being greater than that in the secondary display area, i.e., a resolution of the primary display area being greater than that of the secondary display area, in displaying different parts of content respectively by the primary display area and the secondary display area, to have a smooth transition of a display result between the two display areas, a transitional display area may form between the primary display area and the secondary display area. A display parameter of the transitional display area between the primary display area and the secondary display area may be determined according to the content to be displayed in the primary display area and the secondary display area. The display parameter may be sent to the transitional display area. The transitional display area may serve to display content according to the display parameter.

The display parameter of the transitional display area may serve to provide a smooth transition of a display result between the primary display area and the secondary display area, avoiding a notable difference between display results in the two display areas due to inconsistent resolutions, improving experience of a user in viewing the screen.

Figure 13:
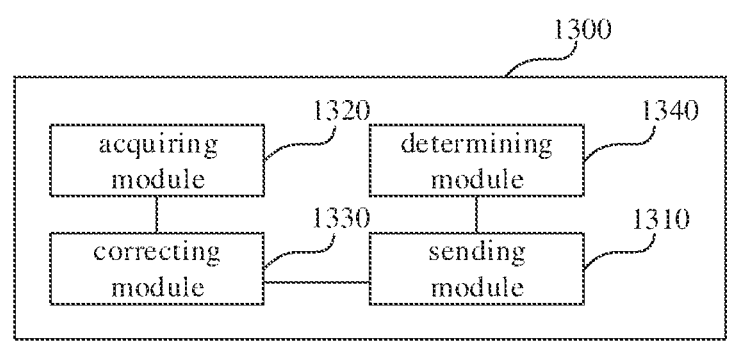
FIG. 13 is a block diagram of an apparatus for controlling a screen of UE according to an exemplary embodiment.

FIG. 13 is a block diagram of an apparatus 1300 for controlling a screen of UE according to an exemplary embodiment. The apparatus 1300 may serve to implement the methods described above. The apparatus 1300 may be implemented as hardware, or as software executed by hardware. The apparatus 1300 may be the UE. The apparatus 1300 may be arranged in the UE. The apparatus 1300 may serve to control the screen of UE according to any of the embodiment described above. As shown in FIG. 13, the apparatus 1300 may include a sending module 1310.

The sending module 1310 may be arranged for: sending a first synchronization signal to the primary display area, and sending a second synchronization signal to the secondary display area. The first synchronization signal and the second synchronization signal may serve to control simultaneous display of one content by both the primary display area and the secondary display area.

The apparatus 1300 may further include an acquiring module 1320 and a correcting module 1330.

The acquiring module 1320 may be arranged for: acquiring a raw color component of the content to be displayed in the primary display area and a raw color component of the content to be displayed in the secondary display area.

The correcting module 1330 may be arranged for: acquiring a corrected color component of the content to be displayed in the primary display area and a corrected color component of the content to be displayed in the secondary display area by performing Gamma correction respectively on the primary display area and the secondary display area.

The sending module 1310 may be further arranged for: sending the corrected color component of the content to be displayed in the primary display area to the primary display area, and sending the corrected color component of the content to be displayed in the secondary display area to the secondary display area.

The apparatus 1300 may further include a determining module 1340.

The determining module 1340 may be arranged for: determining, according to the content to be displayed in the primary display area and the secondary display area, a display parameter of a transitional display area between the primary display area and the secondary display area.

The sending module 1310 may be further arranged for: sending the display parameter to the transitional display area. The transitional display area may serve to display content according to the display parameter.

Division of the functional modules in implementing the function of the apparatus according to the embodiment is merely illustrative. The function may be allocated to be carried out by different functional modules as needed. That is, one functional module may be divided into different functional modules for carrying out all or part of the function.

In an embodiment, there is provided UE that includes the screen according to any of the embodiments described above. The UE may further include a processor, and a memory for storing instructions executable by the processor.

The processor may be arranged for: sending a first synchronization signal to the primary display area, and sending a second synchronization signal to the secondary display area. The first synchronization signal and the second synchronization signal may serve to control simultaneous display of one content both the primary display area and the secondary display area.

The processor may be further arranged for: acquiring a raw color component of the content to be displayed in the primary display area and a raw color component of the content to be displayed in the secondary display area.

The processor may be further arranged for: acquiring a corrected color component of the content to be displayed in the primary display area and a corrected color component of the content to be displayed in the secondary display area by performing Gamma correction respectively on the primary display area and the secondary display area.

The processor may be further arranged for: sending the corrected color component of the content to be displayed in the primary display area to the primary display area. The processor may be further arranged for: sending the corrected color component of the content to be displayed in the secondary display area to the secondary display area.

The processor may be further arranged for: determining, according to the content to be displayed in the primary display area and the secondary display area, a display parameter of a transitional display area between the primary display area and the secondary display area.

The processor may be further arranged for: sending the display parameter to the transitional display area. The processor may be further arranged for: controlling display by the transitional display area according to the display parameter.

The processor may be a Central Processing Unit (CPU), a general purpose processor, a Digital Signal Processor (DSP), an Application Specific Integrated Circuit (ASIC), and/or the like. A general purpose processor may be a microprocessor, any conventional processor, and/or the like. Aforementioned memory may be a Read-Only Memory (ROM), a Random Access Memory (RAM), a flash memory, a hard disk, a solid state disk, and/or the like. A Subscriber Identity Module (SIM) card, also referred to as a smart card, may have to be installed on a digital mobile phone before the phone can be used. Content, such as information on a user of the digital mobile phone, an encryption key, a phonebook of the user, may be stored on the computer chip. A step of the method according to any combination of embodiments herein may be executed by a hardware processor, or by a combination of hardware and software modules in the processor.

Figure 14:
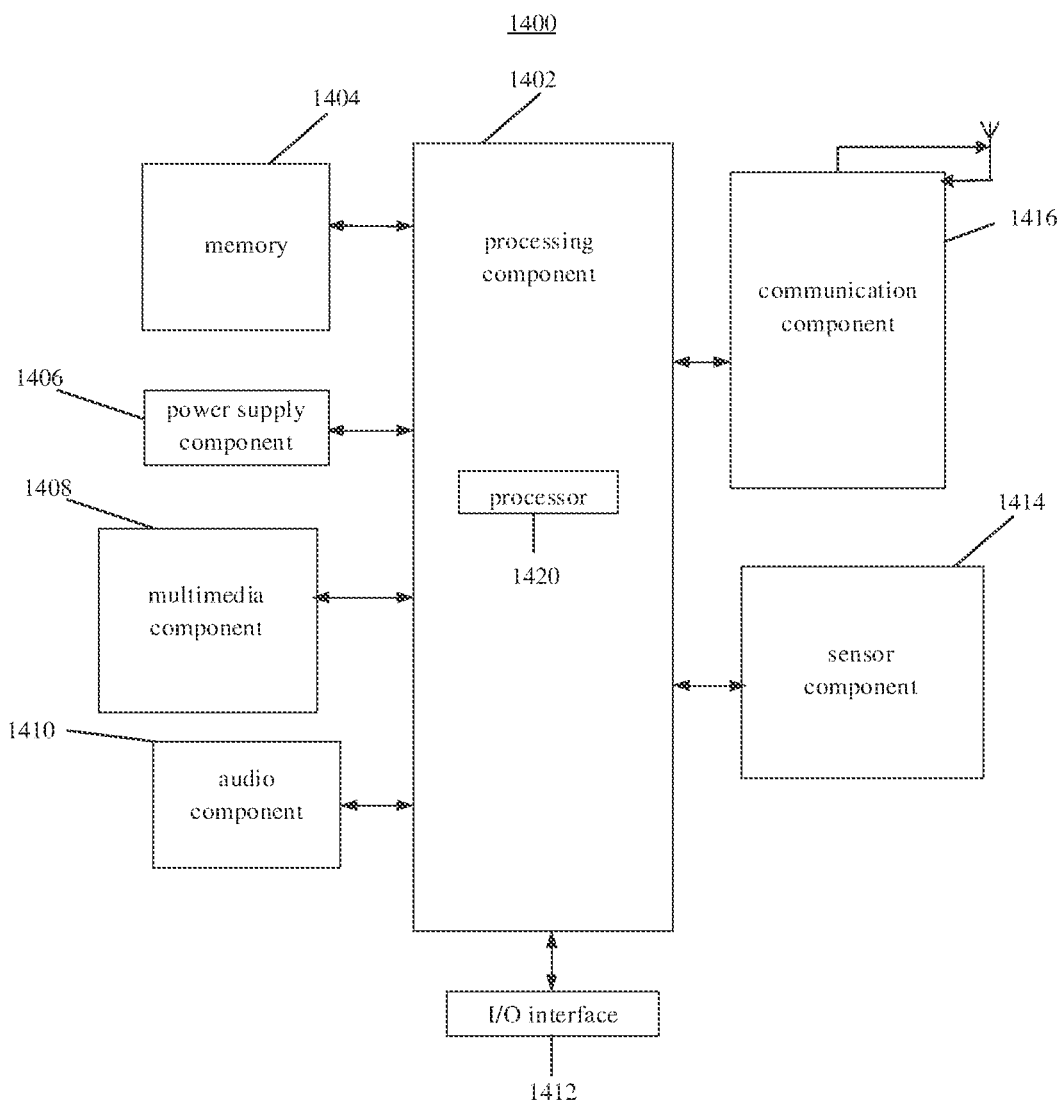
FIG. 14 is a block diagram of UE according to an exemplary embodiment.

FIG. 14 is a block diagram of UE 1400 according to an exemplary embodiment. For example, the UE 1400 may be electronic equipment such as a mobile phone, a tablet, an E-book reader, multimedia playing equipment, wearable equipment, onboard UE, etc.

Referring to FIG. 14, the UE 1400 may include at least one of a processing component 1402, a memory 1404, a power supply component 1406, a multimedia component 1408, an audio component 1410, an Input/Output (I/O) interface 1412, a sensor component 1414, and a communication component 1416.

The processing component 1402 may generally control an overall operation of the UE 1400, such as operations associated with display, a telephone call, data communication, a camera operation, and a recording operation. The processing component 1402 may include one or more processors 1420 to execute instructions so as to complete all or some steps of the method. In addition, the processing component 1402 may include one or more modules to facilitate interaction between the processing component 1402 and other components. For example, the processing component 1402 may include a multimedia module to facilitate interaction between the multimedia component 1408 and the processing component 1402.

The memory 1404 may be arranged for storing various types of data to support the operation at the UE 1400. Examples of such data may include instructions of any application or method arranged for operating on the UE 1400, contact data, phonebook data, messages, pictures, videos, and/or the like. The memory 1404 may be realized by any type of transitory or non-transitory storage equipment or combination thereof, such as Static Random Access Memory (SRAM), Electrically Erasable Programmable Read-Only Memory (EEPROM), Erasable Programmable Read-Only Memory (EPROM), Programmable Read-Only Memory (PROM), Read-Only Memory (ROM), magnetic memory, flash memory, a magnetic disk, or a compact disk.

The power supply component 1406 may supply electric power to various components of the UE 1400. The power supply component 1406 may include a power management system, one or more power sources, and other components related to generating, managing and distributing electricity for the UE 1400.

The multimedia component 1408 may include a screen of UE providing an output interface between the UE 1400 and a user. The screen may be the screen of UE according to the any optional embodiment or the embodiment as shown in FIG. 1. In some embodiments, the multimedia component 1408 may include a front camera and/or a rear camera. When the UE 1400 is in an operation mode such as a shooting mode or a video mode, the front camera and/or the rear camera may receive external multimedia data. Each of the front camera and the rear camera may be a fixed optical lens system or may have a focal length and be capable of optical zooming.

The audio component 1410 may be arranged for outputting and/or inputting an audio signal. For example, the audio component 1410 may include a microphone (MIC). When the UE 1400 is in an operation mode such as a call mode, a recording mode, a voice recognition mode, etc., the MIC may be arranged for receiving an external audio signal. The received audio signal may be further stored in the memory 1404 or may be sent via the communication component 1416. In some embodiments, the audio component 1410 may further include a loudspeaker arranged for outputting the audio signal.

The I/O interface 1412 may provide an interface between the processing component 1402 and a peripheral interface module. Such a peripheral interface module may be a keypad, a click wheel, a button, and/or the like. Such a button may include but is not limited to at least one of: a homepage button, a volume button, a start button, and a lock button.

The sensor component 1414 may include one or more sensors for assessing various states of the UE 1400. For example, the sensor component 1414 may detect an on/off state of the UE 1400 and relative positioning of components such as the display and the keypad of the UE 1400. The sensor component 1414 may further detect a change in the position of the UE 1400 or of a component of the UE 1400, whether there is contact between the UE 1400 and a user, the orientation or acceleration/deceleration of the UE 1400, a change in the temperature of the UE 1400, etc. The sensor component 1414 may include a proximity sensor arranged for detecting existence of a nearby object without physical contact. The sensor component 1414 may further include an optical sensor such as a Complementary Metal-Oxide-Semiconductor (CMOS) or a Charge-Coupled-Device (CCD) image sensor used in an imaging application. In some embodiments, the sensor component 1414 may further include an acceleration sensor, a gyroscope sensor, a magnetic sensor, a pressure sensor, a temperature sensor, etc.

The communication component 1416 may be arranged for facilitating wired or wireless communication between the UE 1400 and other equipment. The UE 1400 may access a wireless network based on a communication standard such as Wi-Fi, 2G, 3G, 4G, 5G, or combination thereof. In an exemplary embodiment, the communication component 1416 may broadcast related information or receive a broadcast signal from an external broadcast management system via a broadcast channel. In an exemplary embodiment, the communication component 1416 may further include a Near Field Communication (NFC) module for short-range communication. In an exemplary embodiment, the communication component 1416 may be based on technology such as Radio Frequency Identification (RFID), Infrared Data Association (IrDA), Ultra-Wideband (UWB) technology, Bluetooth (BT), etc.

In an exemplary embodiment, the UE 1400 may be realized by one or more electronic components such as an Application Specific Integrated Circuit (ASIC), a Digital Signal Processor (DSP), a Digital Signal Processing Device (DSPD), a Programmable Logic Device (PLD), a Field Programmable Gate Array (FPGA), a controller, a microcontroller, a microprocessor, etc., to implement the method.

In an exemplary embodiment, a non-transitory computer-readable storage medium including instructions, such as the memory 1404 including instructions, may be provided. The instructions may be executed by the processor 1420 of the UE 1400 to implement the method. For example, the non-transitory computer-readable storage medium may be Read-Only Memory (ROM), Compact Disc Read-Only Memory (CD-ROM), a magnetic tape, a floppy disk, optical data storage equipment, and/or the like.

A non-transitory computer-readable storage medium may include a computer program which when executed by the processor of the UE 1400, may implement the method for controlling the screen of the UE.

Other embodiments will be apparent to one skilled in the art. The specification is intended to cover any variation, use, or adaptation of the subject disclosure following the general principle of the subject disclosure and including such departures from the subject disclosure as come within known or customary practice in the art. The embodiments are intended to be exemplary only, with a true scope and spirit of the subject disclosure being indicated by the appended claims.

The invention claimed is:

1. A screen, comprising:
   a substrate; and
   a display layer located on top of the substrate,
   wherein the display layer comprises a primary display area and a secondary display area,
   the secondary display area comprises n sub-pixel sequences, n being a positive integer,
   each of the n sub-pixel sequences comprises at least two sub-pixels of identical color,
   the at least two sub-pixels of identical color share one wire,
   the n sub-pixel sequences are arranged one by one along a target direction,
   the n sub-pixel sequences comprise at least one red sub-pixel sequence, one green sub-pixel sequence, and one blue sub-pixel sequence, and
   the at least one red sub-pixel sequence, one green sub-pixel sequence, and one blue sub-pixel sequence are arranged alternately one by one along the target direction.

2. The screen of claim 1, wherein the target direction is a vertical direction or a horizontal direction.

3. The screen of claim 1, wherein center points of respective sub-pixels in at least one of the n sub-pixel sequences are located on one straight line.

4. The screen of claim 1, wherein all center points of respective sub-pixels in at least one of the n sub-pixel sequences are not located on one straight line.

5. The screen of claim 4, wherein an i-th sub-pixel sequence of the n sub-pixel sequences comprises a 2k-th sub-pixel with a center point located on a first straight line and a (2k−1)-th sub-pixel with a center point located on a second straight line, the first straight line being parallel to the second straight line, i being a positive integer no greater than n, k being a positive integer,
wherein a distance between the first straight line and the second straight line equals a distance between center points of two sub-pixels of identical color in the primary display area.

6. The screen of claim 1, wherein a density of pixel distribution in the secondary display area is less than a density of pixel distribution in the primary display area.

7. The screen of claim 6, wherein each sub-pixel in the secondary display area is greater in length than each sub-pixel in the primary display area, and/or each the sub-pixel in the secondary display area is greater in width than each sub-pixel in the primary display area.

8. The screen of claim 1, wherein sub-pixels of identical color in the secondary display area share one wire.

9. The screen of claim 1, wherein the secondary display area comprises at least two sub-areas, sub-pixels of identical color in each of the at least two sub-areas sharing one wire.

10. The screen of claim 6, wherein the display layer further comprises a transitional display area located between the primary display area and the secondary display area,
wherein a display parameter of the transitional display area is determined according to contents to be displayed in the primary display area and the secondary display area, to provide a smooth transition of a display result between the primary display area and the secondary display area, wherein the transitional display area displays a content according to the display parameter.

11. The screen of claim 10, wherein display in the primary display area, display in the secondary display area, and display in the transitional display area are controlled separately.

12. The screen of claim 1,
wherein sub-pixels in the primary display area are arranged according to at least one of a Delta arrangement, a Pentile arrangement, or a standard Red-Green-Blue (RGB) arrangement.

13. User equipment (UE), comprising:
a screen;
a processor; and
a memory for storing instructions executable by the processor,
wherein the screen comprises:
a substrate; and
a display layer located on top of the substrate,
wherein the display layer comprises a primary display area and a secondary display area,
the secondary display area comprises n sub-pixel sequences, n being a positive integer,
each of the n sub-pixel sequences comprises at least two sub-pixels of identical color,
the at least two sub-pixels of identical color share one wire,
the n sub-pixel sequences are arranged one by one along a target direction,
the n sub-pixel sequences comprise at least one red sub-pixel sequence, one green sub-pixel sequence, and one blue sub-pixel sequence,
the at least one red sub-pixel sequence, one green sub-pixel sequence, and one blue sub-pixel sequence are arranged alternately one by one along the target direction,
wherein display in the primary display area and display in the secondary display area are controlled separately by making the primary display area and the secondary display area have separate wires, and
wherein the processor is configured to:
send a first synchronization signal to the primary display area, and send a second synchronization signal to the secondary display area, the first synchronization signal and the second synchronization signal being for controlling simultaneous display of content by both the primary display area and the secondary display area.

14. The UE of claim 13, further comprising:
an optical device arranged below the secondary display area,
wherein the optical device comprises at least one of: a camera, a light sensor, a proximity sensor, an optic transmitter, or an optic receiver.

15. A method for controlling a screen, wherein the screen comprises: a substrate; and a display layer located on top of the substrate, wherein the display layer comprises a primary display area and a secondary display area, the secondary display area comprises n sub-pixel sequences, n being a positive integer, each of the n sub-pixel sequences comprises at least two sub-pixels of identical color, the at least two sub-pixels of identical color share one wire, the n sub-pixel sequences are arranged one by one along a target direction, the n sub-pixel sequences comprise at least one red sub-pixel sequence, one green sub-pixel sequence, and one blue sub-pixel sequence, and the at least one red sub-pixel sequence, one green sub-pixel sequence, and one blue sub-pixel sequence are arranged alternately one by one along the target direction, the method comprising:
sending a first synchronization signal to the primary display area, and sending a second synchronization signal to the secondary display area, the first synchronization signal and the second synchronization signal being for controlling simultaneous display of content by both the primary display area and the secondary display area,
wherein display in the primary display area and display in the secondary display area are controlled separately by making the primary display area and the secondary display area have separate wires.

16. The method of claim 15, further comprising:
acquiring a raw color component of the content to be displayed in the primary display area and a raw color component of the content to be displayed in the secondary display area;
acquiring a corrected color component of the content to be displayed in the primary display area and a corrected color component of the content to be displayed in the secondary display area by performing Gamma correction respectively on the primary display area and the secondary display area;
sending the corrected color component of the content to be displayed in the primary display area to the primary display area, and sending the corrected color component of the content to be displayed in the secondary display area to the secondary display area;

determining, according to the content to be displayed in the primary display area and the secondary display area, a display parameter of a transitional display area between the primary display area and the secondary display area; and sending the display parameter to the transitional display area for controlling display by the transitional display area according to the display parameter.

17. A screen structure, comprising:

n sub-pixel sequences, n being a positive integer, wherein each of the n sub-pixel sequences comprises at least two sub-pixels having identical color, the screen structure comprises at least two sub-pixels that have identical color and share one wire, the n sub-pixel sequences are arranged one by one along a target direction, the n sub-pixel sequences comprise at least one red sub-pixel sequence, one green sub-pixel sequence, and one blue sub-pixel sequence, and the at least one red sub-pixel sequence, one green sub-pixel sequence, and one blue sub-pixel sequence are arranged alternately one by one along the target direction.

* * * * *